US008675118B2

(12) United States Patent
Ryu (10) Patent No.: US 8,675,118 B2
(45) Date of Patent: Mar. 18, 2014

(54) IMAGE SENSOR (75) Inventor: Han-Sung Ryu, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 250 days.

(21) Appl. No.: 13/178,793

(22) Filed: Jul. 8, 2011

(65) Prior Publication Data

US 2012/0081587 A1  Apr. 5, 2012

(30) Foreign Application Priority Data

Sep. 30, 2010  (KR) ........................ 10-2010-0095368

(51) Int. Cl.
*H04N 5/225* (2006.01)
*H04N 3/14* (2006.01)
*H04N 5/335* (2011.01)
*G02B 13/16* (2006.01)
*H01L 27/00* (2006.01)
*H01L 27/14* (2006.01)
*H01L 31/0232* (2006.01)

(52) U.S. Cl.
USPC ........... 348/340; 348/294; 348/302; 348/335; 250/208.1; 257/414; 257/428; 257/431; 257/432

(58) Field of Classification Search
USPC ................. 348/294–324, 335–369; 250/208.1
See application file for complete search history.

(56) References Cited

U.S. PATENT DOCUMENTS

| | | | | |
|---|---|---|---|---|
| 5,493,143 A * | 2/1996 | Hokari | ........................... | 257/432 |
| 5,902,997 A * | 5/1999 | Kropp | ........................... | 250/216 |
| 6,417,022 B1 * | 7/2002 | Hsiao et al. | ...................... | 438/70 |
| 6,909,554 B2 * | 6/2005 | Liu et al. | ........................ | 359/626 |
| 7,375,312 B2 * | 5/2008 | Butterworth | .............. | 250/214 R |
| 7,629,662 B2 * | 12/2009 | Lee | ................................. | 257/440 |
| 8,134,633 B2 * | 3/2012 | Watanabe | ...................... | 348/335 |
| 8,300,108 B2 * | 10/2012 | van Hoorebeke et al. | . | 348/218.1 |
| 8,314,469 B2 * | 11/2012 | Yu | .................................. | 257/432 |
| 8,390,931 B2 * | 3/2013 | Boettiger et al. | ............. | 359/619 |
| 2003/0011888 A1 * | 1/2003 | Cox et al. | ...................... | 359/626 |
| 2006/0023314 A1 * | 2/2006 | Boettiger et al. | ............. | 359/621 |
| 2006/0027732 A1 * | 2/2006 | Ahn | ........................... | 250/208.1 |
| 2006/0145223 A1 * | 7/2006 | Ryu | ................................. | 257/294 |
| 2006/0175287 A1 * | 8/2006 | Boettiger et al. | .............. | 216/26 |
| 2009/0034083 A1 * | 2/2009 | Li et al. | ........................ | 359/619 |
| 2009/0128672 A1 * | 5/2009 | Watanabe | ...................... | 348/273 |
| 2011/0057277 A1 * | 3/2011 | Yu | .................................. | 257/432 |
| 2011/0284980 A1 * | 11/2011 | Sakoh et al. | ................... | 257/432 |

FOREIGN PATENT DOCUMENTS

| | | | |
|---|---|---|---|
| JP | 2004140426 A | | 5/2004 |
| KR | 20090052076 A | | 5/2009 |
| KR | 20090098002 A | | 9/2009 |

* cited by examiner

*Primary Examiner* — Michael Osinski
(74) *Attorney, Agent, or Firm* — Harness, Dickey & Pierce, P.L.C.

(57) ABSTRACT

An image sensor includes an objective lens arranged on an optical axis; a substrate including a plurality of photoelectric conversion devices; and a micro lens layer including a plurality of micro lenses corresponding to each of the plurality of photoelectric conversion devices, respectively, wherein the plurality of micro lenses includes a central micro lens corresponding to a central portion of the objective lens, and an edge micro lens corresponding to an edge portion of the objective lens, and the plurality of micro lenses are configured such that focal lengths of the micro lenses increase from the central micro lens toward the edge micro lens.

9 Claims, 7 Drawing Sheets

IMAGE SENSOR

CROSS-REFERENCE TO RELATED APPLICATION

This application claims priority under 35 U.S.C. §119 to Korean Patent Application No. 10-2010-0095368 filed on Sep. 30, 2010 in the Korean Intellectual Property Office (KIPO), the entire contents of which are incorporated herein by reference.

BACKGROUND

1. Field

At least one example embodiment relates to an image sensor.

2. Description of the Related Art

An image sensor converts an optical image into an electrical signal. With recent advancements in computer and communication industries, the demand for image sensors with enhanced performance is increasing in various fields such as digital cameras, camcorders, personal communication systems (PCS), game devices, security cameras, and medical micro cameras.

In particular, metal oxide semiconductor (MOS) image sensors can be driven by using a simple driving method and can be implemented by using various scanning methods. Further, the size of a product can be reduced since signal processing circuits can be integrated into a single chip, and manufacturing costs can be reduced because MOS process techniques can be compatibly used. Due to their very low power consumption, MOS image sensors can be applied to products with limited battery capacity. Therefore, with the advances in implementation of high resolution MOS image sensors, the use of MOS image sensors is rapidly increasing.

SUMMARY

At least one example embodiment provides an image sensor capable of maximizing an amount of light incident on photoelectric conversion devices.

Other objects of at least some example embodiments will be described in or be apparent from the following description of the embodiments.

According to an aspect of at least one example embodiment, an image sensor includes an objective lens arranged on an optical axis; a substrate including a plurality of photoelectric conversion devices; and a micro lens layer including a plurality of micro lenses corresponding to each of the plurality of photoelectric conversion devices, respectively, wherein the plurality of micro lenses includes a central micro lens corresponding to a central portion of the objective lens, and an edge micro lens corresponding to an edge portion of the objective lens, and the plurality of micro lenses are configured such that focal lengths of the micro lenses increase from the central micro lens toward the edge micro lens.

According to an aspect of at least one example embodiment an image sensor includes an objective lens arranged on an optical axis; a substrate including a plurality of photoelectric conversion devices; and a micro lens layer including a plurality of micro lenses corresponding to each of the plurality of photoelectric conversion devices, respectively, wherein the plurality of micro lenses includes a central micro lens corresponding to a central portion of the objective lens, and an edge micro lens corresponding to an edge portion of the objective lens, and a focal length of the central micro lens is different from a focal length of the edge micro lens, and focal lengths of the plurality of micro lenses corresponding to the photoelectric conversion devices on which lights having different wavelengths are incident are different from each other.

According to an aspect of at least one example embodiment an image sensor includes a substrate; a plurality of photoelectric conversion devices on the substrate; an objective lens; and a plurality of micro lenses in between the objective lens and the plurality of photoelectric conversion devices, the plurality of micro lenses being configured such that focal lengths of the plurality of micro lenses vary with horizontal distances between a center point of the objective lens and center points of the micro lenses.

The other aspects of at least one example embodiment are included in the detailed description and drawings.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (for example, "between" versus "directly between", "adjacent" versus "directly adjacent", etc.).

The terminology used herein is for the purpose of describing particular embodiments only and is not intended to be limiting of example embodiments. As used herein, the singular forms"a", "an" and "the" are intended to include the plural form's as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
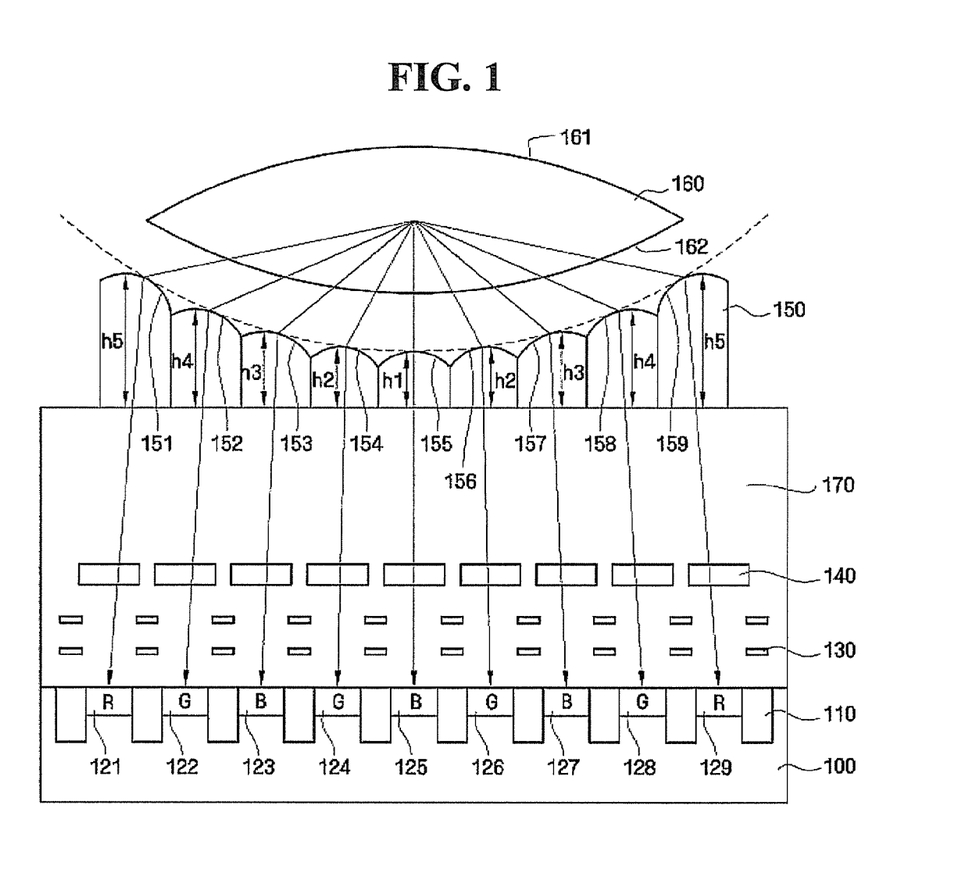
FIGS. 1 and 2 are cross sectional views of an image sensor in accordance with at least one example embodiment.
Figure 2:
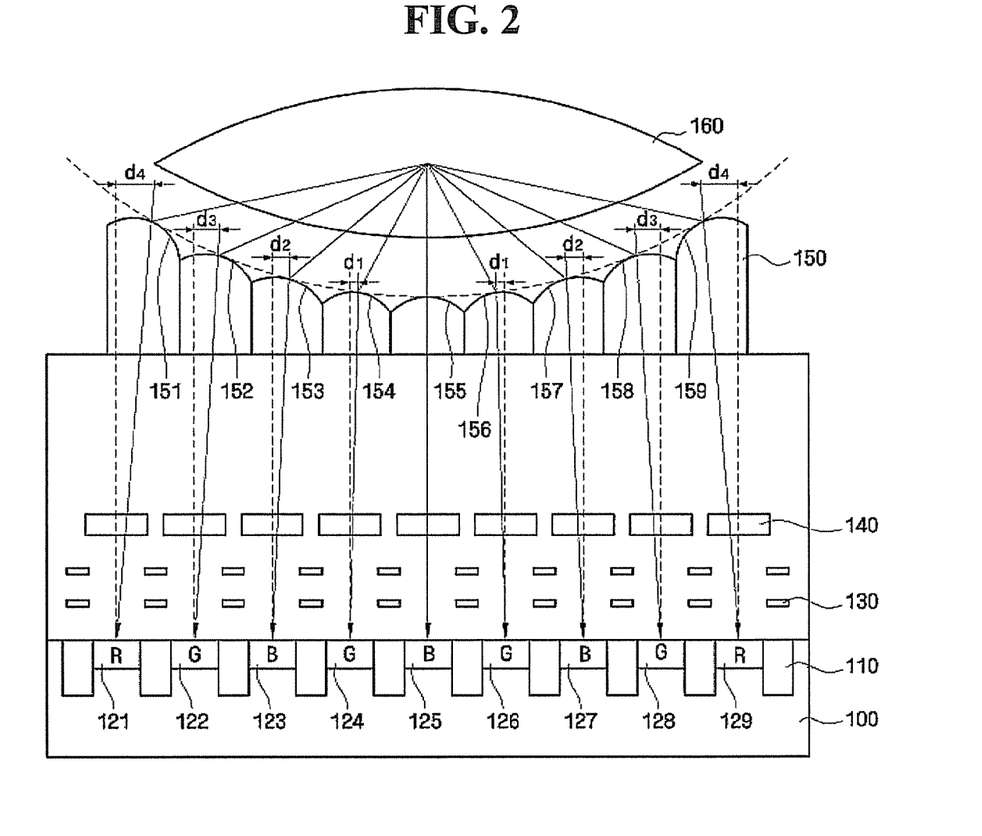
Figure 3:
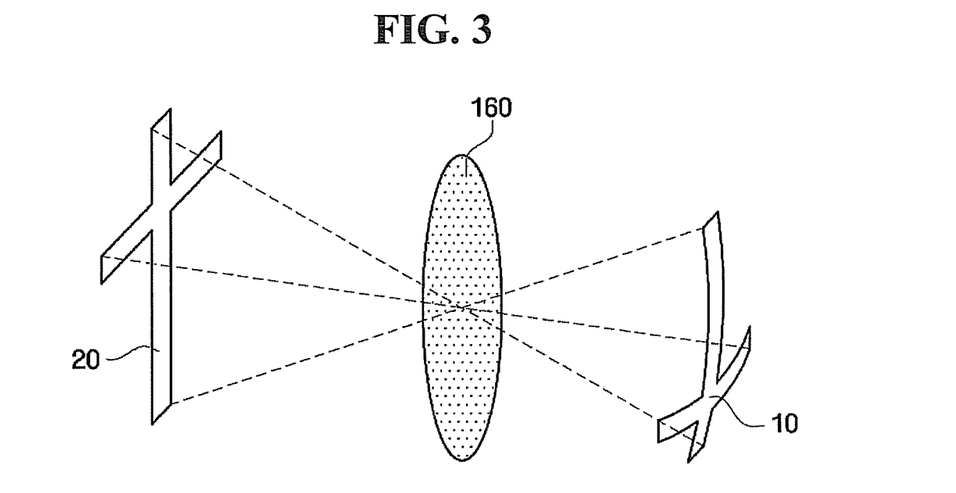
FIG. 3 is a diagram for explaining field curvature aberration of an objective lens.
Figure 4:
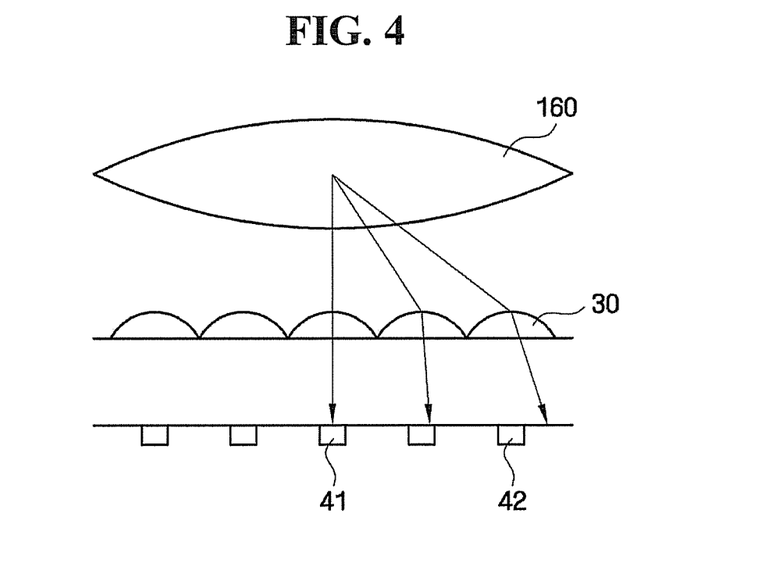
FIG. 4 is a diagram for explaining a difference in an amount of light incident into photoelectric conversion devices according to relative positions from an objective lens.

Hereinafter, an image sensor in accordance with at least one example embodiment will be described with reference to FIGS. 1 to 4. FIGS. 1 and 2 are cross sectional views of the image sensor in accordance with at least one example embodiment. FIG. 3 is a diagram for explaining field curvature aberration of an objective lens. FIG. 4 is a diagram for explaining a difference in an amount of light incident into photoelectric conversion devices according to relative positions from an objective lens.

Referring to FIG. 1, device isolation regions 110 are formed in a substrate 100, and an active region is defined by the device isolation regions 110. Generally, the device isolation regions 110 may be shallow trench isolation (STI) or field oxide (FOX) formed by a local oxidation of silicon (LOCOS) method.

For example, a first conductive type (for example, p type) substrate may be used as the substrate 100. Although not shown in the drawings, an epitaxial layer may be formed on the substrate 100, or a plurality of wells may be formed in the substrate 100. For example, a silicon-on-insulator (SOI) substrate including a lower silicon substrate, a buried insulating layer faulted on the lower silicon substrate, and a silicon semiconductor layer formed on the buried insulating layer may be used as the substrate 100.

A plurality of photoelectric conversion devices 121 to 129 are formed in the substrate 100. The photoelectric conversion devices 121 to 129 may include, for example, red photoelectric conversion devices 121 and 129 on which red light is incident, green photoelectric conversion devices 122, 124, 126 and 128 on which green light is incident, and blue photoelectric conversion devices 123, 125 and 127 on which blue light is incident. The photoelectric conversion devices 121 to 129 may absorb colored light having passed through color filters 140 to produce and/or accumulate charges corresponding to an amount of light. The photoelectric conversion devices 121 to 129 may be formed by using photo transistors, photo gates, photodiodes, pinned photodiodes, or a combination thereof. In this embodiment, a case where the photoelectric conversion devices 121 to 129 are photodiodes will be described as an example. Separation distances between the photoelectric conversion devices 121 to 129 may be equal or increase as it goes from a central portion to edge portions of the image sensor.

Metal lines 130 may be formed in multiple layers on the substrate 100 on which the photoelectric conversion devices 121 to 129 are formed. The metal lines 130 may be arranged to overlap the device isolation regions 110. The metal lines 130 may guide light incident on the photoelectric conversion devices 121 to 129 to be reflected by the sides of the metal lines 130 toward the photoelectric conversion devices 121 to 129. Accordingly, it is possible to prevent light incident on each of the photoelectric conversion devices from reaching a neighboring photoelectric conversion device, thereby preventing optical crosstalk.

The color filters 140 are formed on a layer including the metal lines 130. A planarization film 170 may be formed on the color filters 140. The planarization film 170 may also serve to adjust a focal length.

A micro lens layer 150 is formed on the planarization film 170. The micro lens layer 150 serves to focus externally incident light on the photoelectric conversion devices 121 to 129. The micro lens layer 150 includes a plurality of micro lenses 151 to 159, which correspond to the photoelectric conversion devices 121 to 129, respectively. The width of the micro lenses 151 to 159 may be similar to the width of the photoelectric conversion devices 121 to 129, and may have a diameter of, for example, 0.5 µm to 10 µm. The micro lenses 151 to 159 may have the same width. Alternatively, the widths of the micro lenses 151 and 159 located at edge portions of the image sensor may be formed to be larger than the width of the micro lens 155 positioned at a central portion of the image sensor. The widths of the micro lenses 151 to 159 may be formed to increase as it goes from the central portion to the edge portions of the image sensor.

An objective lens 160 is disposed on the micro lens layer 150 to focus external light on the micro lens layer 150. The objective lens 160 is formed at a predetermined or reference thickness and a radius of curvature to have an appropriate refraction angle in consideration of, for example, the size and depth of the image sensor. The external light is transmitted into the image sensor at a predetermined or reference refraction angle due to, for example, the radius of curvature and the thickness of the objective lens 160. The transmitted external light is focused on the photoelectric conversion devices 121 to 129 at a predetermined or reference refraction angle again through the micro lens layer 150. A first surface 161 and a second surface 162 of the objective lens 160 may be spherical or aspherical surfaces. Further, the first surface 161 of the objective lens 160 provided on the light incident side may have a positive refractive power, and the second surface 162 facing the first surface 161 may have a negative refractive power.

The micro lenses 151 and 159 positioned corresponding to the edge portions of the objective lens 160 are faulted to have focal lengths longer than that of the micro lens 155 positioned corresponding to the central portion of the objective lens 160. Specifically, the respective focal lengths of the micro lenses 151 to 159 may be formed to increase from the micro lens 155 corresponding to the central portion of the objective lens 160 to the micro lenses 151 and 159 corresponding to the edge portions of the objective lens 160. For example, heights h1 to h5 from the top surface of the planarization film 170 to central points of the top surfaces of the respective micro lenses 151 to 159 may be formed to increase from the micro lens 155 corresponding to the central portion of the objective lens 160 toward the micro lenses 151 and 159 corresponding to the edge portions of the objective lens 160. The greater the heights h1 to h5 from the top surface of the planarization film 170 to the central points of the top surfaces of the respective micro lenses 151 to 159, the longer the focal lengths of the micro lenses 151 to 159.

Referring to FIG. 3, there is field curvature aberration as an example of aberration of the objective lens 160. The field curvature aberration is a phenomenon in which as incident light comes from the position farther from an optical axis, an image is formed at the closer position to the objective lens 160. Accordingly, a focal point of each point is formed on a spherical surface, not a planar surface, to a curved image 10 for a planar object 20. Consequently, the image 10 of the object 20 has a lower definition as it goes farther from an optical axis.

Referring to FIG. 1, in this embodiment, it is possible prevent a reduction in resolution at the edge portions of the image sensor due to the field curvature aberration of the objective lens 160 by making the focal lengths of the micro lenses 151 and 159 positioned corresponding to the edge portions of the objective lens 160 longer than the focal length of the micro lens 155 positioned corresponding to the central portion of the objective lens 160.

Referring to FIG. 2, horizontal distances d1 to d4 between the central points of the top surfaces of the micro lenses 151 to 159 and the central points of the surfaces of the photoelectric conversion devices 121 to 129 corresponding thereto may increase as it goes from the micro lens 155 corresponding to the central portion of the objective lens 160 toward the micro lenses 151 and 159 corresponding to the edge portions of the objective lens 160. In this case, the micro lens 155 positioned corresponding to the center of the objective lens 160 and the photoelectric conversion device 125 corresponding thereto may be formed such that the central point of the top surface of the micro lens 155 coincides with the central point of the surface of the photoelectric conversion device 125. That is, the horizontal distance between the central point of the top surface of the micro lens 155 and the central point of the surface of the photoelectric conversion device 125 may be zero.

Referring to FIG. 4, the light incident into the image sensor is incident on micro lenses 30 at a predetermined or reference refraction angle due to, for example, the radius of curvature and the thickness of the objective lens 160. The incident light passing through the micro lenses 30 is incident on the respective photoelectric conversion devices 41 and 42 at a predetermined or reference refraction angle at each of the micro lenses 30. In this case, almost vertical light is incident on the photoelectric conversion device 41 positioned corresponding to the center of the objective lens 160, thereby receiving a maximum amount of light. However, the photoelectric conversion device 42 positioned corresponding to the edge portion of the objective lens 160 may receive a significantly low amount of light due to a difference in an incidence angle.

Referring to FIG. 2, according to at least one example embodiment, it is possible prevent a reduction in an amount of light incident on the photoelectric conversion devices 121 and 129 positioned at the edge portions of the image sensor by lengthening the horizontal distances d4 between the central points of the top surfaces of the micro lenses 151 and 159 positioned corresponding to the edge portions of the objective lens 160 and the central points of the surfaces of the photoelectric conversion devices 121 and 129 as compared to the horizontal distance between the central point of the top surface of the micro lens 155 positioned corresponding to the central portion of the objective lens 160 and the central point of the surface of the photoelectric conversion device 125.

Further, referring to FIGS. 1 and 2, according to at least one example embodiment, micro lenses 151 to 159 may be configured such that both 1) focal lengths of the micro lenses 151 to 159 and 2) horizontal distances d between the central points of the top surfaces of the micro lenses 151 and 159 and the central points of the surfaces of corresponding photoelectric conversion devices 121 and 129 increase from a position corresponding to a central portion of the objective lens 160 to positions corresponding to edge portions of the objective lens 160.

Further, according to at least one example embodiment, the micro lenses 151 to 159 may be configured such that as the wavelength of light incident on the photoelectric conversion devices 121 to 129 is longer, the focal length of the respective micro lenses 151 to 159 corresponding to the photoelectric conversion devices 121 to 129 becomes smaller. For example, according to at least one example embodiment, the micro lenses 151 to 159 may be configured such that the focal length of the micro lenses 153, 155 and 157 corresponding to the blue photoelectric conversion devices 123, 125 and 127 is longer than the focal length of the micro lenses 152, 154, 156 and 158 corresponding to the green photoelectric conversion devices 122, 124, 126 and 128. Further, according to at least one example embodiment, the micro lenses 151 to 159 may be configured such that the focal length of the micro lenses 152, 154, 156 and 158 corresponding to the green photoelectric conversion devices 122, 124, 126 and 128 is longer than the focal length of the micro lenses 151 and 159 corresponding to the red photoelectric conversion devices 121 and 129.

Specifically, according to at least one example embodiment, the micro lenses 151 to 159 may be configured such that as the wavelength of light incident on the photoelectric conversion devices 121 to 129 is longer, the radius of curvature of the respective micro lenses 151 to 159 corresponding to the photoelectric conversion devices 121 to 129 becomes smaller. For example, the micro lenses 151 to 159 may be configured such that the radius of curvature of the micro lenses 153, 155 and 157 corresponding to the blue photoelectric conversion devices 123, 125 and 127 is larger than the radius of curvature of the micro lenses 152, 154, 156 and 158 corresponding to the green photoelectric conversion devices 122, 124, 126 and 128. Further, according to at least one example embodiment, the micro lenses 151 to 159 may be configured such that the radius of curvature of the micro lenses 152, 154, 156 and 158 corresponding to the green photoelectric conversion devices 122, 124, 126 and 128 is larger than the radius of curvature of the micro lenses 151 and 159 corresponding to the red photoelectric conversion devices 121 and 129. It is possible to make the focal length of the micro lenses 151 to 159 relatively longer by increasing the radius of curvature.

If the wavelengths of light incident on the respective photoelectric conversion devices 121 to 129 are different, the focal points of the light are created at different positions from the surfaces of the photoelectric conversion devices 121 to 129. For example, as the wavelength of light incident on the photoelectric conversion devices 121 to 129 is longer, the focal point of the light may be created at a position farther from the surfaces of the photoelectric conversion devices 121 to 129. Accordingly, the photosensitivity may vary according to the photoelectric conversion devices 121 to 129.

According to at least one example embodiment, the focal points of light incident on the photoelectric conversion devices 121 to 129 are created at positions separated by the same distance from the surfaces of the photoelectric conversion devices 121 to 129 by relatively lengthening the focal lengths of the micro lenses 153, 155 and 157 formed corresponding to the photoelectric conversion devices on which light having a short wavelength is incident, for example, the blue photoelectric conversion devices 123, 125 and 127 and relatively shortening the focal lengths of the micro lenses 151 and 159 formed corresponding to the photoelectric conversion devices on which light having a long wavelength is incident, for example, the red photoelectric conversion devices 121 and 129. Accordingly, it is possible to enhance efficiency of the photoelectric conversion.

Figure 5:
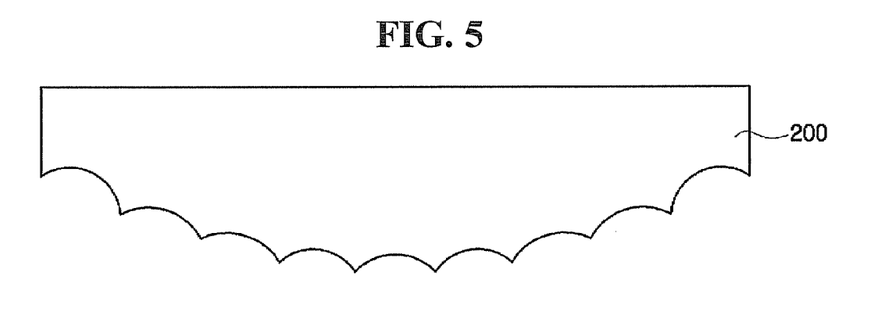
FIGS. 5 to 7 are cross sectional views showing steps of a method of forming a micro lens layer in accordance with at least one example embodiment.
Figure 6:
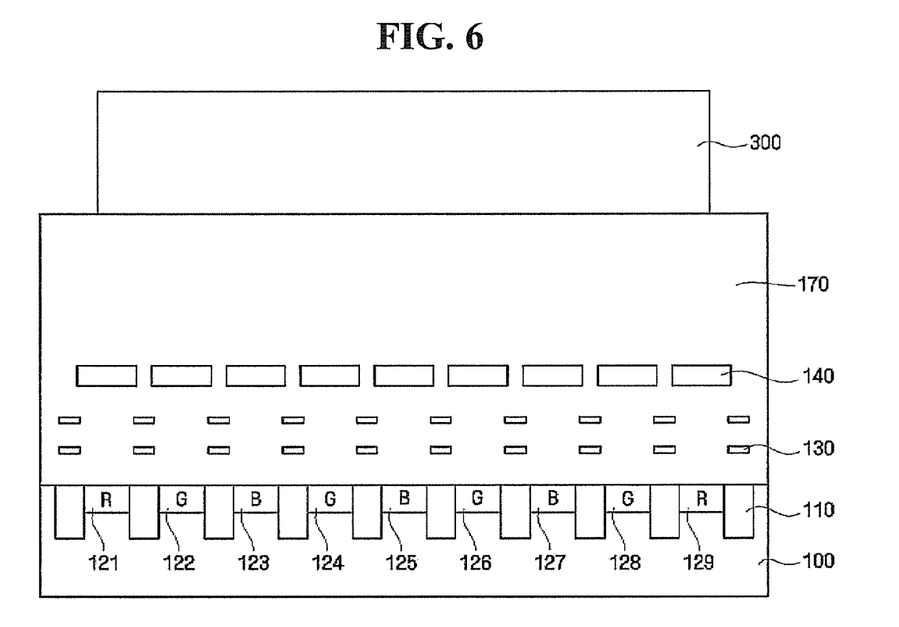
Figure 7:
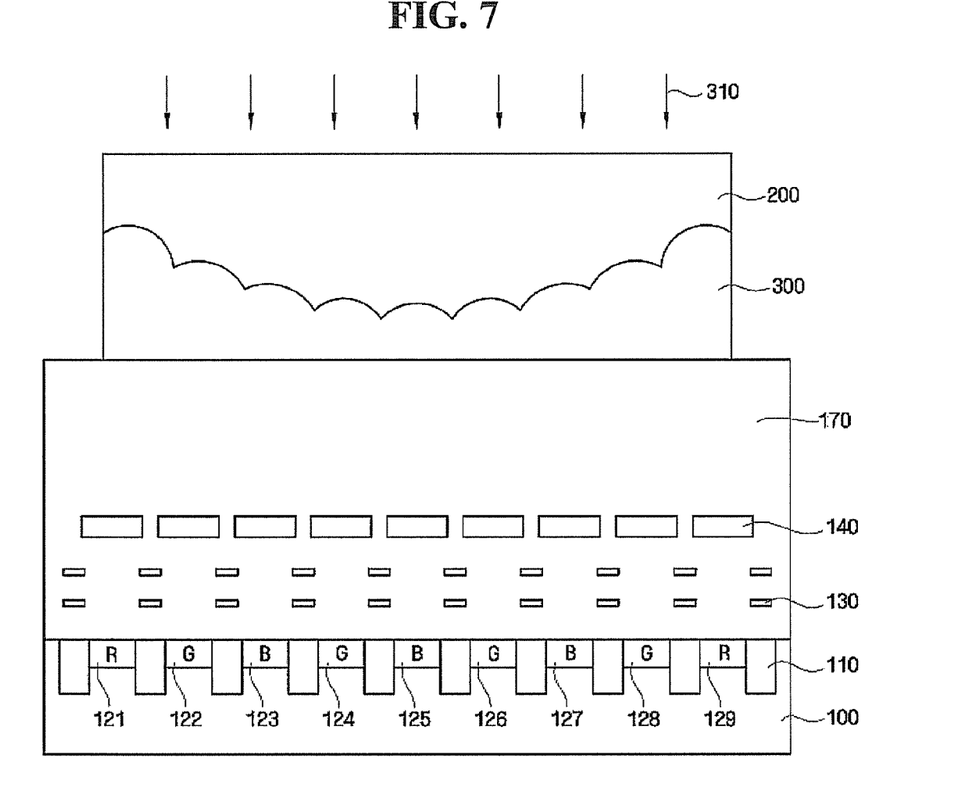

A method of forming a micro lens layer in accordance with at least one example embodiment will be described with reference to FIGS. 5 to 7. FIGS. 5 to 7 are cross sectional views showing steps of a method of forming a micro lens layer in accordance with at least one example embodiment. The examples illustrated in FIGS. 5 to 7 include many of the same elements as the examples illustrated in FIGS. 1 and 2. Accordingly, detailed description of these elements will be omitted.

Referring to FIG. 5, a mold 200 in which the top surface of the micro lens layer 150 (see FIG. 1) has been engraved is prepared. The mold 200 may be formed of a transparent material such as glass and epoxy.

Referring to FIG. 6, a material layer 300 for forming a micro lens layer is formed on the planarization film 170. The material layer 300 for a micro lens layer may be formed of photocurable resin, for example, ultraviolet (UV) curable resin such as epoxy.

Referring to FIG. 7, the mold 200 is arranged such that the engraved surface of the mold 200 faces the material layer 300 for a micro lens layer. The mold 200 is impressed on the material layer 300 for a micro lens layer. Then, light 310, for example, ultraviolet light, is irradiated on the mold 200 to perform a UV imprinting process for curing the material layer 300 for a micro lens layer. In order to easily separate the mold 200 from the material layer 300 for a micro lens layer, a release agent or the like may be coated on the engraved surface of the mold 200.

According to at least one example embodiment, the micro lens layer 150 of FIG. 1 designed optimally for each unit pixel can be easily formed by an imprinting process using photocurable resin and a mold.

Figure 8:
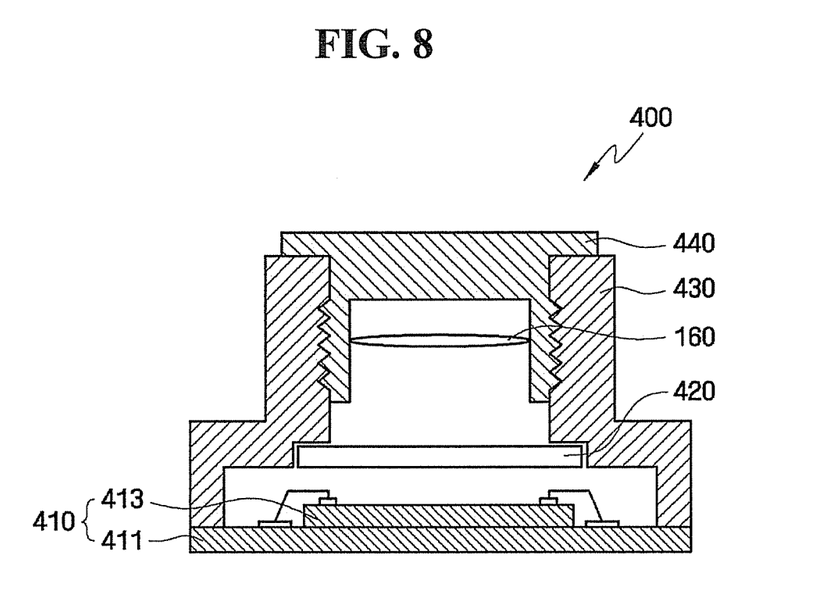
FIG. 8 illustrates a camera apparatus including an image sensor in accordance with at least one example embodiment.
Figure 9:
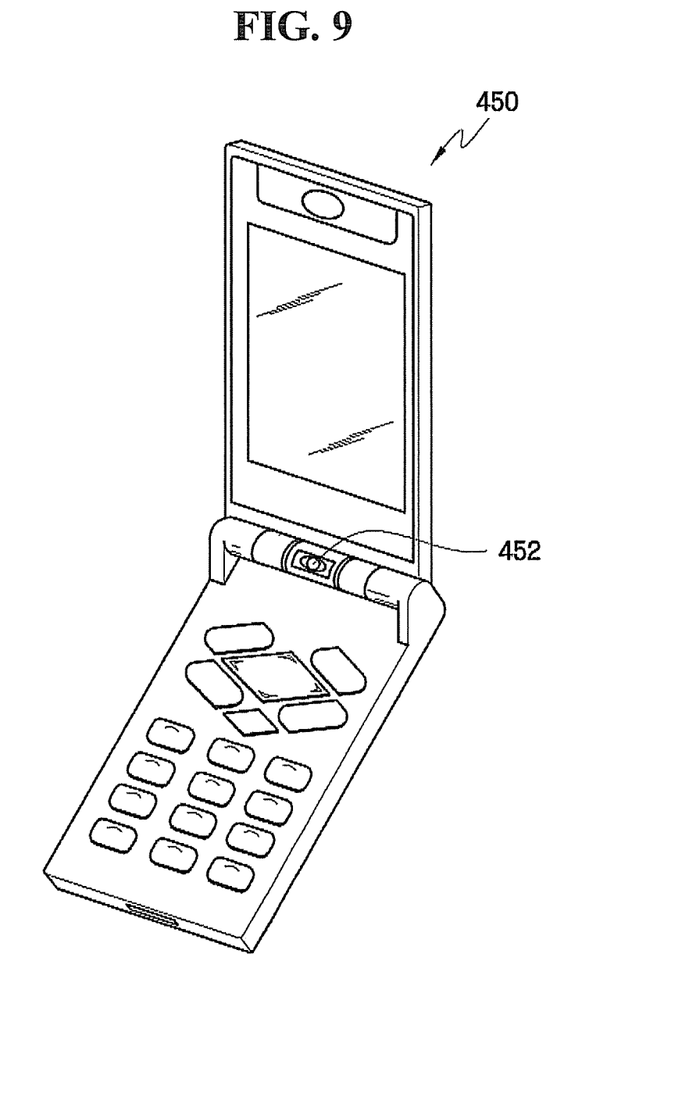
FIG. 9 illustrates a mobile phone including an image sensor in accordance with at least one example embodiment.

Hereinafter, a processor-based system including an image sensor in accordance with embodiments of at least one example embodiment will be explained with reference to FIGS. 8 and 9. FIG. 8 illustrates a camera apparatus including an image sensor in accordance with at least one example embodiment. FIG. 9 illustrates a mobile phone including an image sensor in accordance with at least one example embodiment. Image sensors in accordance with example embodiments discussed above with reference to FIGS. 1-7 may be also used in other apparatuses (for example, a scanner, a mechanized clock apparatus, a navigation apparatus, a video phone, a security system, an automatic focusing apparatus, a tracking apparatus, a motion monitoring apparatus, an image stabilization apparatus and the like) in addition to the above-mentioned apparatuses.

Referring to FIG. 8, a camera apparatus 400 includes an image sensor package 410 in which an image sensor 413 is mounted on a circuit board 411 through bonding wires. Further, a housing 430 is attached to the circuit board 411 and the housing 430 protects the circuit board 411 and the image sensor 413 from external environment.

A barrel 440 through which light passes to form an image to be captured is coupled to the housing 430. The objective lens 160 is installed in the barrel 440 and can be moved along a thread of the barrel 440.

Referring to FIG. 9, an image sensor 452 is provided at a predetermined or reference position of a mobile phone system 450. It is apparent to those skilled in the art that the image sensor 452 may be provided at a portion different from the position shown in FIG. 9.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image sensor comprising:
    an objective lens arranged on an optical axis;
    a substrate including a plurality of photoelectric conversion devices; and
    a micro lens layer including a plurality of micro lenses corresponding to each of the plurality of photoelectric conversion devices, respectively,
    wherein the plurality of micro lenses includes a central micro lens corresponding to a central portion of the objective lens, and an edge micro lens corresponding to an edge portion of the objective lens,
    wherein the plurality of micro lenses are configured such that as a wavelength of light incident on each of the photoelectric conversion devices increases, a focal length of a corresponding one of the plurality of micro lenses decreases, and
    the plurality of micro lenses are configured such that focal lengths of the micro lenses increase from the central micro lens toward the edge micro lens.

2. The image sensor of claim 1, wherein the plurality of micro lenses are configured such that heights from a top surface of the substrate to central points of top surfaces of the plurality of micro lenses increase from the central micro lens toward the edge micro lens.

3. The image sensor of claim 2, wherein the plurality of micro lenses are configured such that horizontal distances between the central point of the top surfaces of the plurality of micro lenses and a central point of a surface of corresponding ones of the photoelectric conversion devices increase from the central micro lens toward the edge micro lens.

4. The image sensor of claim 3, wherein the plurality of micro lenses are configured such that the horizontal distance between the central point of the top surface of the central micro lens and the central point of the surface of the corresponding one of the plurality of photoelectric conversion devices is zero.

5. The image sensor of claim 1, wherein the plurality of micro lenses are configured such that as a wavelength of light incident on each of the photoelectric conversion devices increases, a radius of curvature of a corresponding one of the plurality of micro lenses decreases.

6. The image sensor of claim 3, wherein the plurality of micro lenses are configured such that as the wavelength of light incident on each of the photoelectric conversion devices increases, a radius of curvature of a corresponding one of the plurality of micro lenses decreases.

7. The image sensor of claim 1, wherein the micro lens layer is formed of photocurable resin.

8. The image sensor of claim 7, wherein the micro lenses are formed by performing an ultraviolet (UV) imprinting process using a mold with an engraved shape of the micro lenses.

9. The image sensor of claim 1, further comprising:
color filters disposed between the substrate and the micro lens layer.

\* \* \* \* \*